US012602159B2

(12) United States Patent
Rana et al.

(10) Patent No.: US 12,602,159 B2
(45) Date of Patent: Apr. 14, 2026

(54) APPARATUS HAVING SEGMENTED DATA LINES AND METHODS OF THEIR OPERATION

(71) Applicant: MICRON TECHNOLOGY, INC., Boise, ID (US)

(72) Inventors: Vikas Rana, Pehowa (IN); Kalyan Chakravarthy Kavalipurapu, Telangana (IN)

(73) Assignee: Micron Technology, Inc., Boise, ID (US)

( * ) Notice: Subject to any disclaimer, the term of this patent is extended or adjusted under 35 U.S.C. 154(b) by 257 days.

(21) Appl. No.: 18/117,553

(22) Filed: Mar. 6, 2023

(65) Prior Publication Data

US 2023/0325085 A1 Oct. 12, 2023

Related U.S. Application Data

(60) Provisional application No. 63/327,832, filed on Apr. 6, 2022.

(51) Int. Cl.
| | |
|---|---|
| *G11C 16/26* | (2006.01) |
| *G06F 3/06* | (2006.01) |
| *G11C 16/04* | (2006.01) |
| *G11C 16/10* | (2006.01) |
| *G11C 16/24* | (2006.01) |

(52) U.S. Cl.
CPC ............ *G06F 3/061* (2013.01); *G06F 3/0656* (2013.01); *G06F 3/0659* (2013.01); *G06F 3/0679* (2013.01); *G11C 16/0483* (2013.01); *G11C 16/10* (2013.01); *G11C 16/24* (2013.01); *G11C 16/26* (2013.01)

(58) Field of Classification Search
CPC .......... G11C 16/10; G11C 16/24; G11C 16/26
See application file for complete search history.

(56) References Cited

U.S. PATENT DOCUMENTS

| | | | |
|---|---|---|---|
| 5,265,050 A | 11/1993 | McLaury | |
| 5,311,478 A | 5/1994 | Zagar et al. | |
| 5,323,350 A | 6/1994 | McLaury | |
| 7,450,422 B2 | 11/2008 | Roohparvar | |
| 7,551,467 B2 | 6/2009 | Roohparvar | |
| 2022/0044746 A1* | 2/2022 | Hsu | ........................ G11C 16/26 |

* cited by examiner

*Primary Examiner* — Jason Lappas
(74) *Attorney, Agent, or Firm* — Dicke, Billig & Czaja, PLLC

(57) ABSTRACT

Memory might include an array of memory cells and a data line selectively connected to a plurality of memory cells of the array of memory cells. The data line might include a first data line segment corresponding to a first subset of memory cells of the plurality of memory cells and a second data line segment corresponding to a second subset of memory cells of the plurality of memory cells. The second data line segment is selectively connected to the first data line segment. A first page buffer might be selectively connected to the first data line segment, and a second page buffer might be selectively connected to the second data line segment.

22 Claims, 15 Drawing Sheets

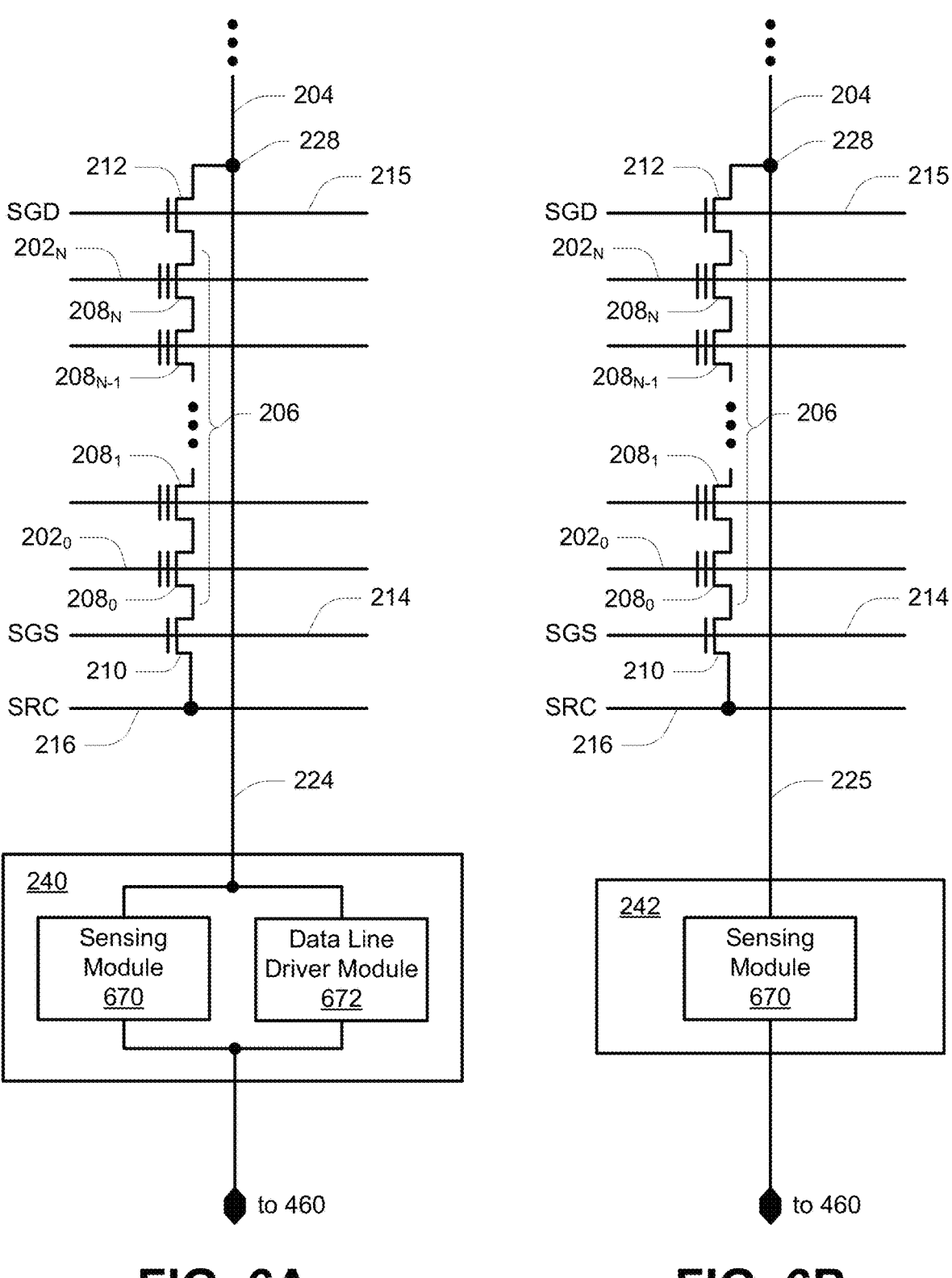
FIG. 6A          FIG. 6B

APPARATUS HAVING SEGMENTED DATA LINES AND METHODS OF THEIR OPERATION

RELATED APPLICATION

This application claims the benefit of U.S. Provisional Application No. 63/327,832, filed on Apr. 6, 2022, hereby incorporated herein in its entirety by reference.

TECHNICAL FIELD

The present disclosure relates generally to memory and, in particular, in one or more embodiments, the present disclosure relates to apparatus having segmented data lines and methods of their operation.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC might use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is deemed to be activated in response to a particular voltage applied to its control gate, such as by detecting whether a data line connected to the memory cell experiences a sufficient change in voltage level caused by current flow through the memory cell. As memory operation advances to represent additional data states per memory cell, the margins between adjacent Vt distributions can become smaller. These Vt distributions can further shift and widen over time.

Peripheral circuitry for programming and sensing data states of an array of memory cells is often located under that array of memory cells. As the memory density of a memory device, e.g., a number of memory cells per area of die, increases, the area available for such peripheral circuitry becomes more constrained.

BRIEF DESCRIPTION OF THE DRAWINGS

FIG. 6A is a schematic of a primary data line segment of a data line connected to a NAND string and to a respective primary page buffer in accordance with an embodiment.

FIG. 6B is a schematic of a secondary data line segment of a data line connected to a NAND string and to a respective secondary page buffer in accordance with an embodiment.

DETAILED DESCRIPTION

Figure 1:
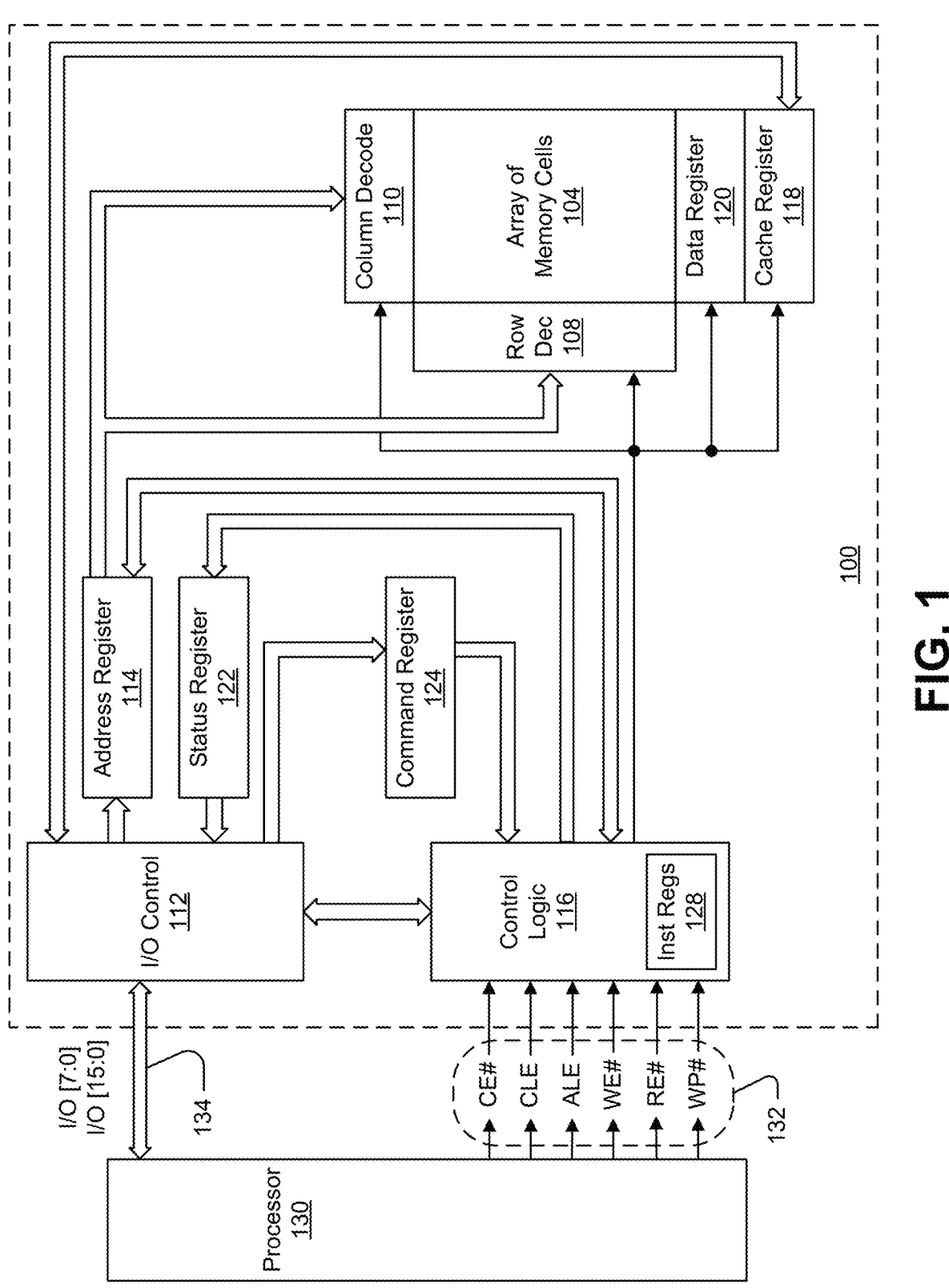
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

Random read performance can be an important performance metric of a memory. Random read operations might generally be thought of as a plurality of read operations on memory cells located at a variety of distributed addresses (e.g., non-sequential addresses) of the array of memory cells, e.g., reading several small files distributed about the array of memory cells. In contrast, sequential read operations might be thought of as a plurality of read operations performed on memory cells located at sequential addresses of the array of memory cells, e.g., reading a large file stored to a contiguous address space of the array of memory cells.

Random read performance can be improved by dividing an array of memory cells into multiple memory planes. However, this has generally required the duplication of page buffers and other peripheral circuitry for each memory plane, making it increasingly difficult to place all of the peripheral circuitry under the array of memory cells. Various embodiments facilitate approaching or attaining the random read performance of an array of memory cells having multiple memory planes, but without full duplication of page buffer and related circuitry for each memory plane.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target (e.g., desired) data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) page buffer circuitry of the memory device 100. The page buffer circuitry might contain sensing modules (not shown in FIG. 1) to sense a data state of a memory cell of the array of memory cells 104, e.g., by sensing a state of a data line connected to that memory cell. Page buffer circuitry might further contain a data line driver module (not shown in FIG. 1) to store data to be programmed to the array of memory cells 104 and to drive data lines to appropriate voltage levels in response to received data values to be programmed to the array of memory cells 104. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
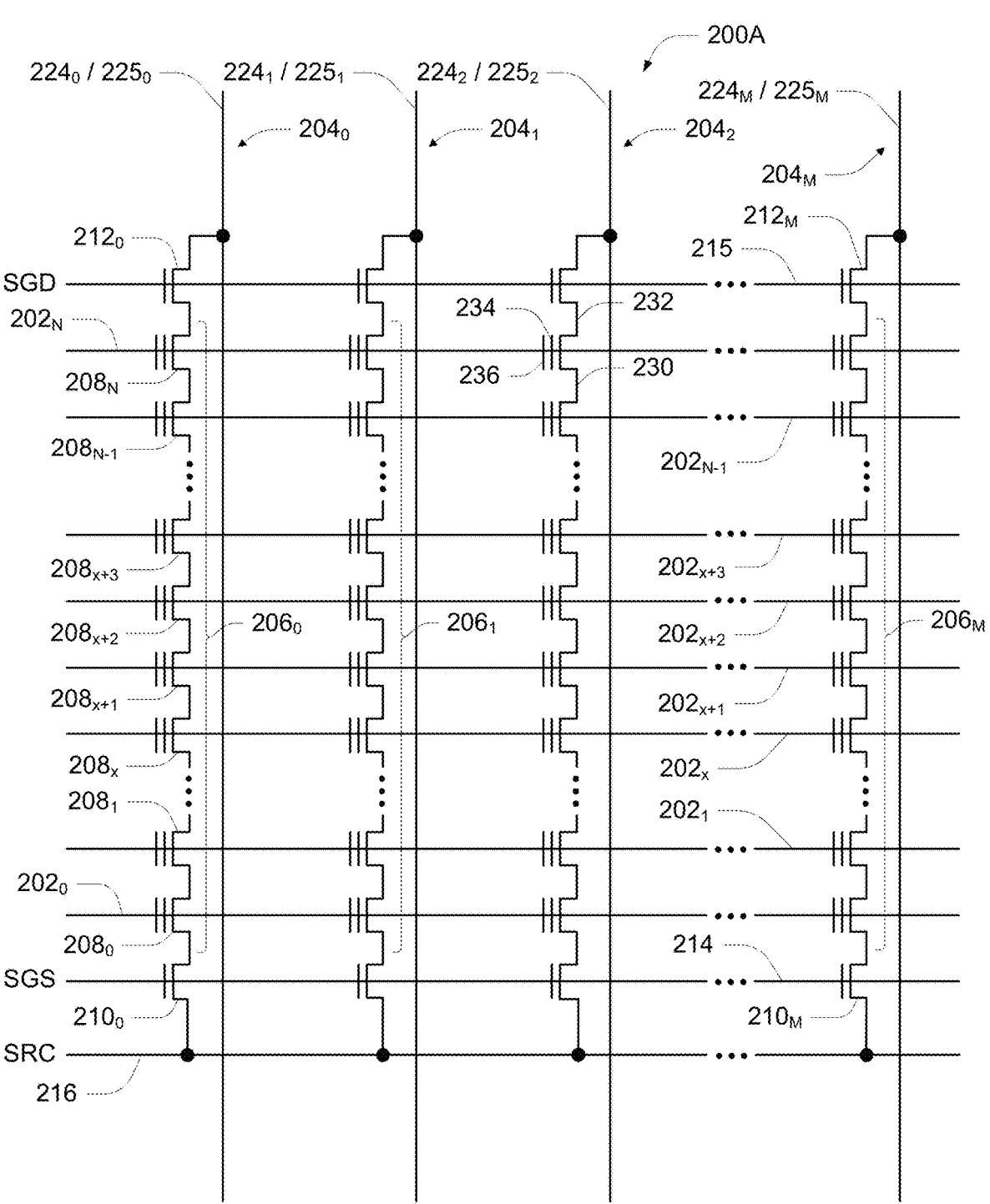
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. In FIG.

2A, the depicted portions of data lines 204 might each represent a primary data line segment 224 of a data line 204, e.g., primary data line segments $224_0$ to $224_M$, or might each represent a secondary data line segment 225 of a data line 204, e.g., secondary data line segments $225_0$ to $225_M$, as will be described in more detail infra. A subset of memory cells corresponding to a given data line segment, e.g., a primary data line segment 224 or a secondary data line segment 225, includes those memory cells selectively connected to that data line segment without relying on a connection through a different data line segment. The access lines 202 might be connected (e.g., selectively connected) to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
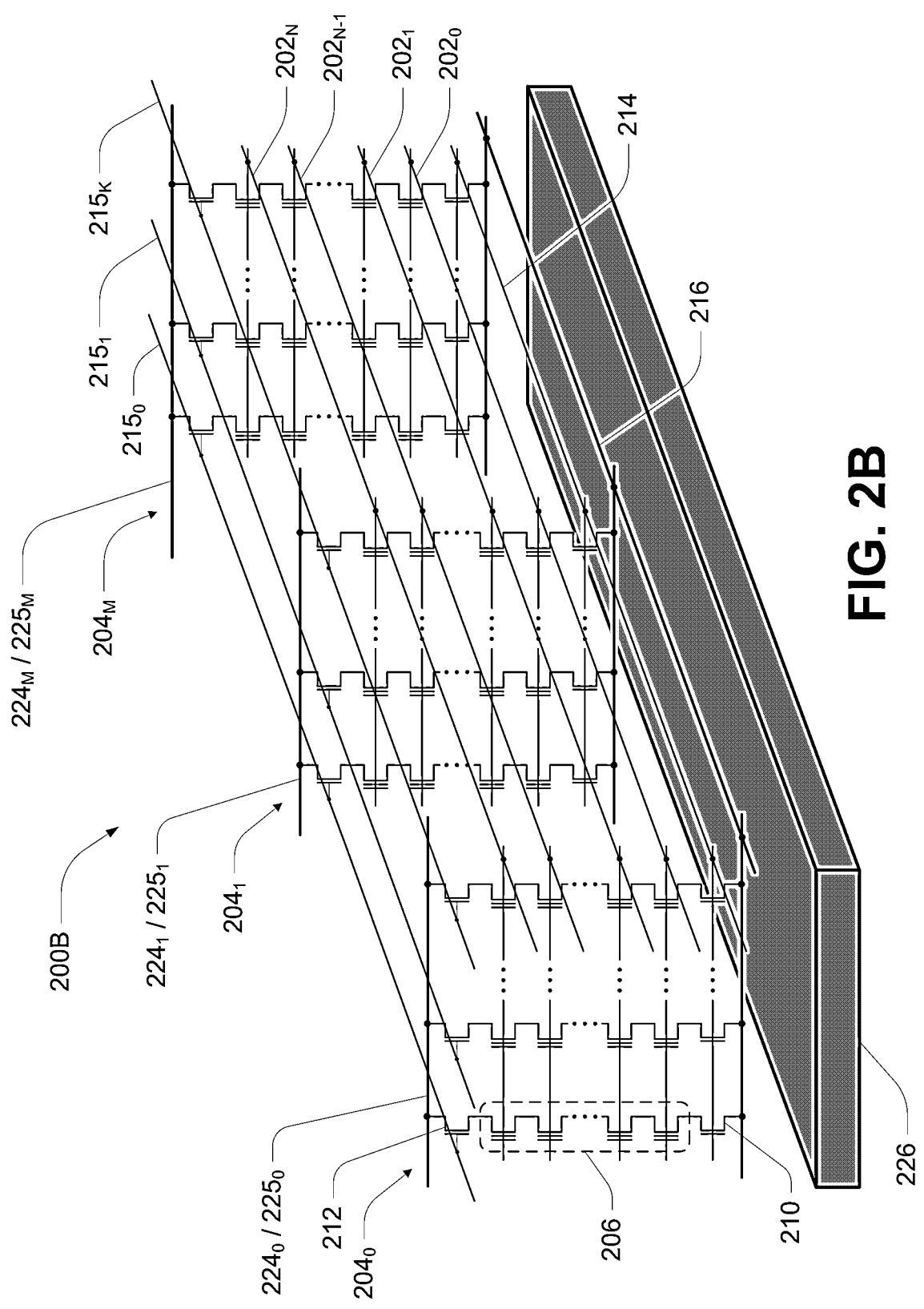

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. The portion of the array of memory cells 200A of FIG. 2A might be a portion of the array of memory cells 200B of FIG. 2B, for example. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206, e.g., a region through which current might flow when a memory cell, e.g., a field-effect transistor, is activated. The semiconductor pillars might be solid, or might have a hollow core. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). In FIG. 2B, the depicted portions of the data lines 204 might each represent a primary data line segment 224 of a data line 204, e.g., primary data line segments $224_0$ to $224_M$, or might each represent a secondary data line segment 225 of a data line 204, e.g., secondary data line segments $225_0$ to $225_M$, as will be described in more detail infra. Multiple NAND strings 206 might be selectively connected to the same data line 204, and to the same primary data line segment 224 or secondary data line segment 225. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B, including page buffer circuitry. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
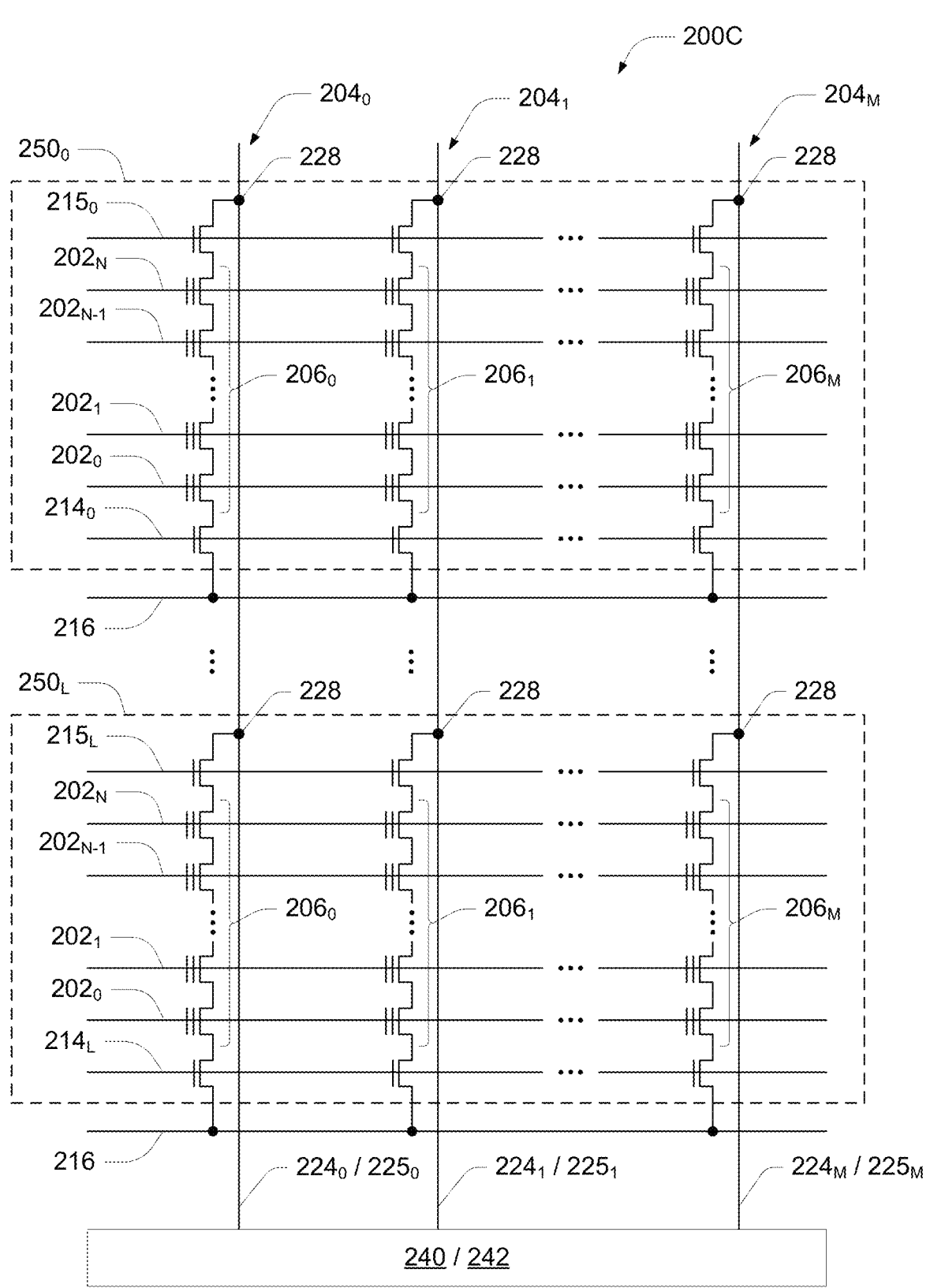

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. The portion of the array of memory cells 200A of FIG. 2A might be a portion of the array of memory cells 200C of FIG. 2C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells $250_0$-$250_L$.

In FIG. 2C, the depicted portions of the data lines 204 might each represent a primary data line segment 224 of a data line 204, e.g., primary data line segments $224_0$ to $224_M$, or might each represent a secondary data line segment 225 of a data line 204, e.g., secondary data line segments $225_0$ to $225_M$, as will be described in more detail infra. The data lines 204, and thus the primary data line segments $224_0$ to $224_M$ and the secondary data line segments $225_0$ to $225_M$, might be selectively connected to the NAND strings 206 through data line contacts 228.

For primary data line segments 224, the primary data line segments $224_0$-$224_M$ might be connected (e.g., selectively connected) to a primary page buffer of page buffer circuitry of the memory. The primary page buffer 240 might correspond to a memory plane (e.g., the set of blocks of memory cells $250_0$-$250_L$ connected to its corresponding primary data line segments $224_0$-$224_M$) for a read operation, and to more than one memory plane for a programming operation (e.g., the set of blocks of memory cells $250_0$-$250_L$ connected to its corresponding primary data line segments $224_0$-$224_M$ and one or more sets of blocks of memory cells 250 connected to corresponding one or more secondary data line segments $225_0$-$225_M$), as will be described in more detail infra. The primary page buffer 240 might include a sensing module (not shown in FIG. 2C) for sensing data values indicated on respective primary data line segments 224 and for storage of the sensed data values from its corresponding memory plane, and might further include a data line driver module (not shown in FIG. 2C) for storing data values to be programmed to any of its corresponding memory planes, and for driving the respective data lines 204 (e.g., each including a primary data line segment 224 and one or more secondary data line segments 225) to appropriate voltage levels for programming of those stored data values to its selected corresponding memory plane.

For secondary data line segments 225, the secondary data line segments $225_0$-$225_M$ might be connected (e.g., selectively connected) to a secondary page buffer 242, which might be a portion of page buffer circuitry of the memory. The secondary page buffer 242 might correspond to a memory plane (e.g., the set of blocks of memory cells $250_0$-$250_L$ connected to its corresponding secondary data line segments $225_0$-$225_M$) for a read operation. The secondary page buffer 242 might include a sensing module (not shown in FIG. 2C) for sensing data values indicated on respective secondary data line segments 225 and for storage of the sensed data values from its corresponding memory plane. The secondary page buffer 242 might be devoid of a data line driver module, and thus might be incapable of performing a programming operation, e.g., incapable of selectively enabling or inhibiting programming in response to received data, as will be described in more detail infra.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer 240 responsive to its respective select line 215.

Figure 3:
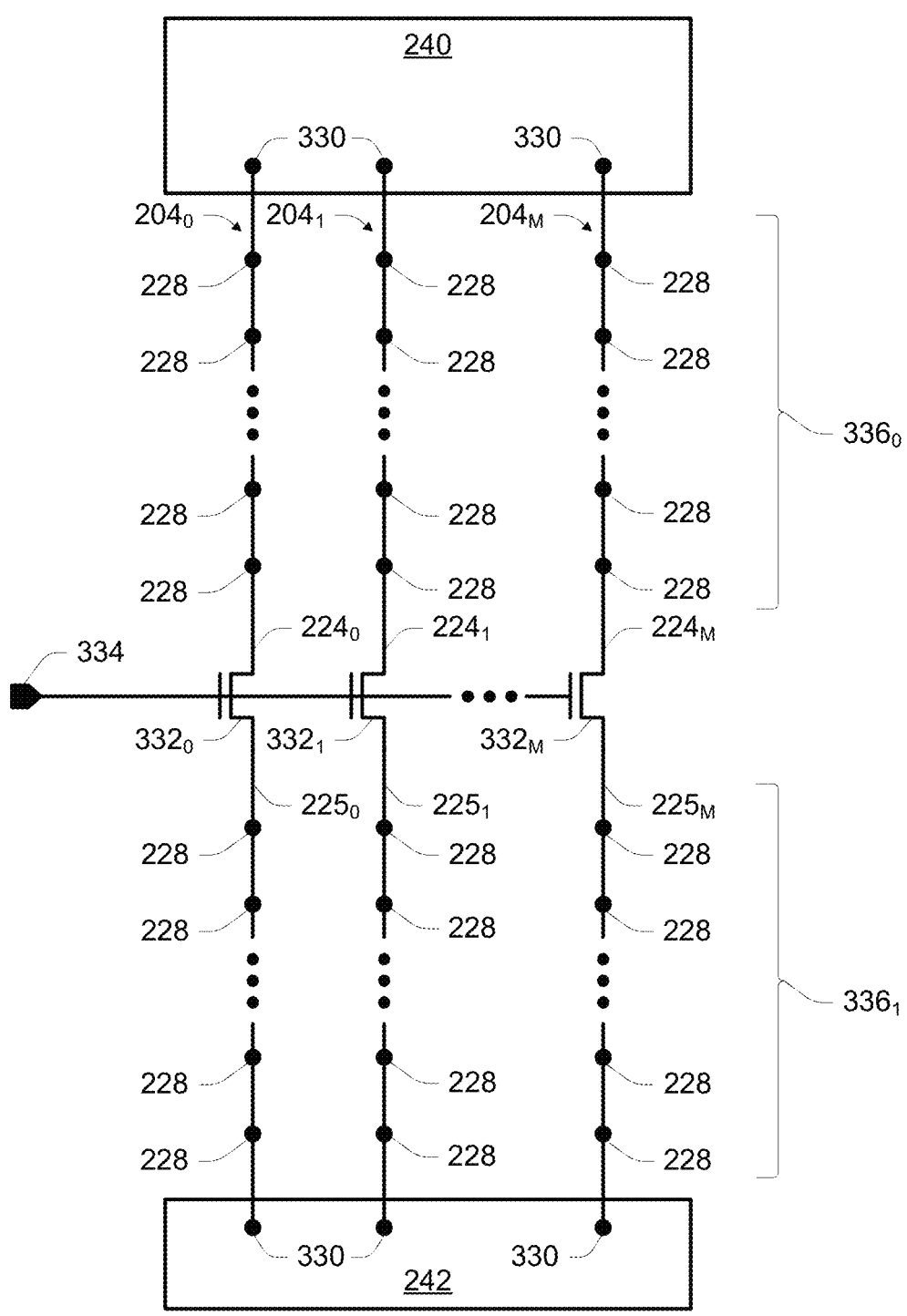
FIG. 3 is a schematic of data lines having data line segments connected to respective page buffers in accordance with an embodiment.

FIG. 3 is a schematic of data lines having data line segments connected to respective page buffers in accordance with an embodiment. In FIG. 2A, the depicted data lines 204, e.g., data lines $204_0$ to $204_M$, might each include a primary data line segment 224, e.g., primary data line segments $224_0$ to $224_M$, respectively, and a secondary data line segment 225, e.g., secondary data line segments $225_0$ to $225_M$, respectively. Each primary data line segment 224 might be selectively connected to its respective secondary data line segment 225 through a respective switch, e.g., a field-effect transistor or other switchable element. Such switchable elements might include any circuit element or combination of circuit elements capable of selectively providing either electrical connection between the two data line segments, or electrical isolation between the two data line segments. For simplicity, the switches 332, e.g., switches $332_0$ to $332_M$, are depicted to be field-effect transistors, e.g., n-type field effect transistors of nFETs. The switches 332 might each be responsive to a control signal 334. For example, field-effect transistors $332_0$ to $332_M$ could have their control gates commonly connected to receive the control signal 334.

FIG. 3 depicts the data line contacts 228 to the NAND strings 206, although the NAND strings 206 are not depicted in FIG. 3 for clarity. A subset of memory cells corresponding to a given data line segment, e.g., a primary data line segment 224 or a secondary data line segment 225, might include those memory cells selectively connected to a data line contact 228 that is directly connected to that data line segment. For example, the primary data line segment $224_0$ might correspond to a subset of memory cells including those NAND strings 206 that could be selectively connected to the primary data line segment $224_0$ even if the switch $332_0$ were deactivated (e.g., open). Those NAND strings 206 selectively connected (e.g., through a select gate directly connected) to a primary data line segment 224 of the set of primary data line segments $224_0$ to $224_M$ might correspond to a first memory plane $336_0$, while those NAND strings 206 selectively connected (e.g., through a select gate directly connected) to a secondary data line segment 225 of the set of secondary data line segments $225_0$ to $225_M$ might correspond to a second memory plane $336_1$.

The primary data line segments $224_0$ to $224_M$ might be connected (e.g., selectively connected) to the primary page buffer 240 through data line contacts 330. The secondary data line segments $225_0$ to $225_M$ might be connected (e.g., selectively connected) to the secondary page buffer 242 through data line contacts 330. The primary page buffer 240 and the secondary page buffer 242 might collectively be referred to as page buffer circuitry of the memory.

During various access operations on an array of memory cells, a data line might experience a wide variety of voltage levels. For example, during programming operations and read operations of memory cells, data lines might experience voltage levels generally between a reference potential, e.g., Vss, and a supply voltage level, e.g., Vcc. However, during erase operations, data lines might experience voltages exceeding 20 V. To protect the page buffer circuitry, e.g., the primary page buffer 240 and the secondary page buffer 242, the data lines 204 might be connected to the page buffer circuitry through isolation devices.

Figure 4A:
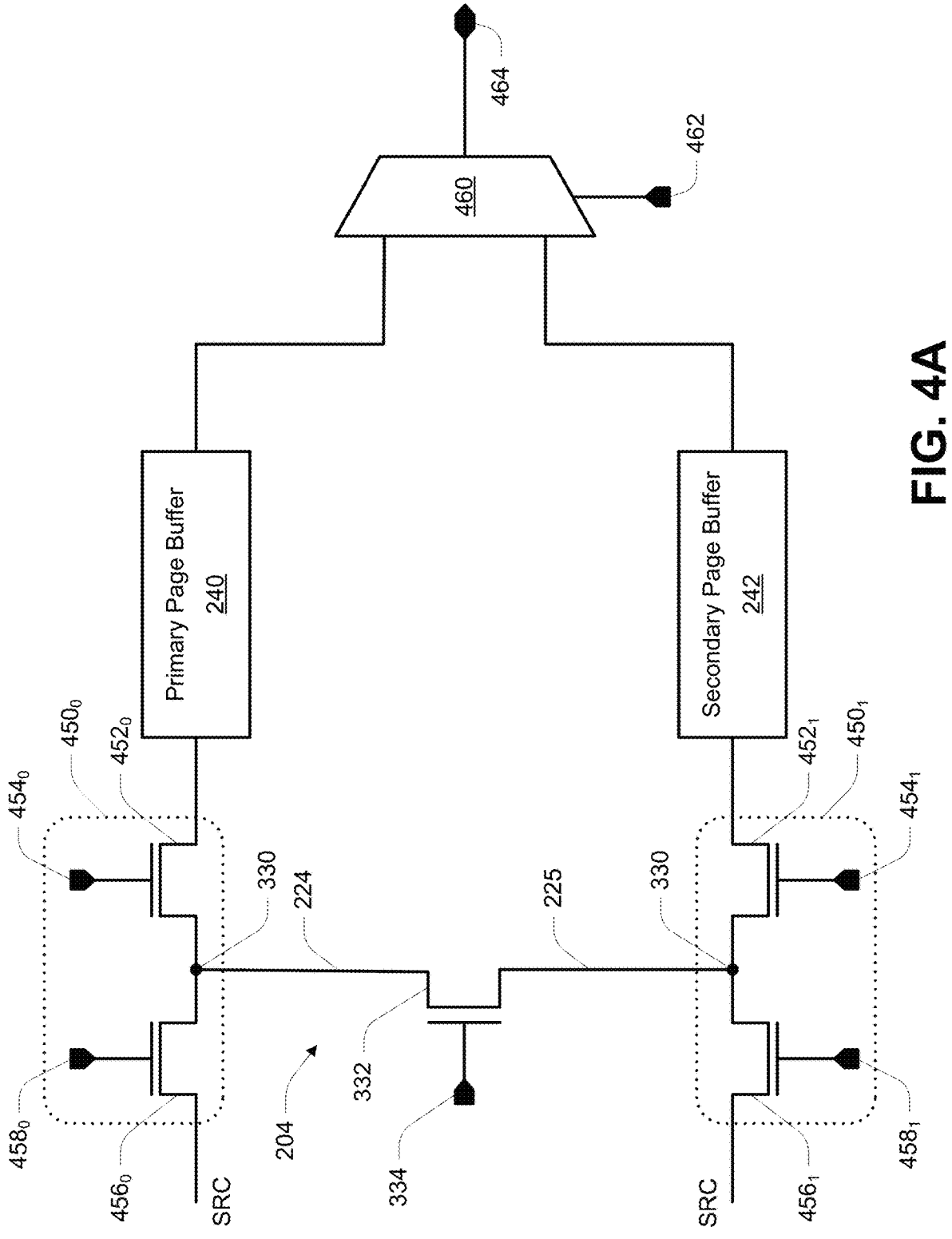
FIGS. 4A-4B are schematics of a data line having data line segments connected to respective page buffers through isolation devices in accordance with other embodiments.
Figure 4B:
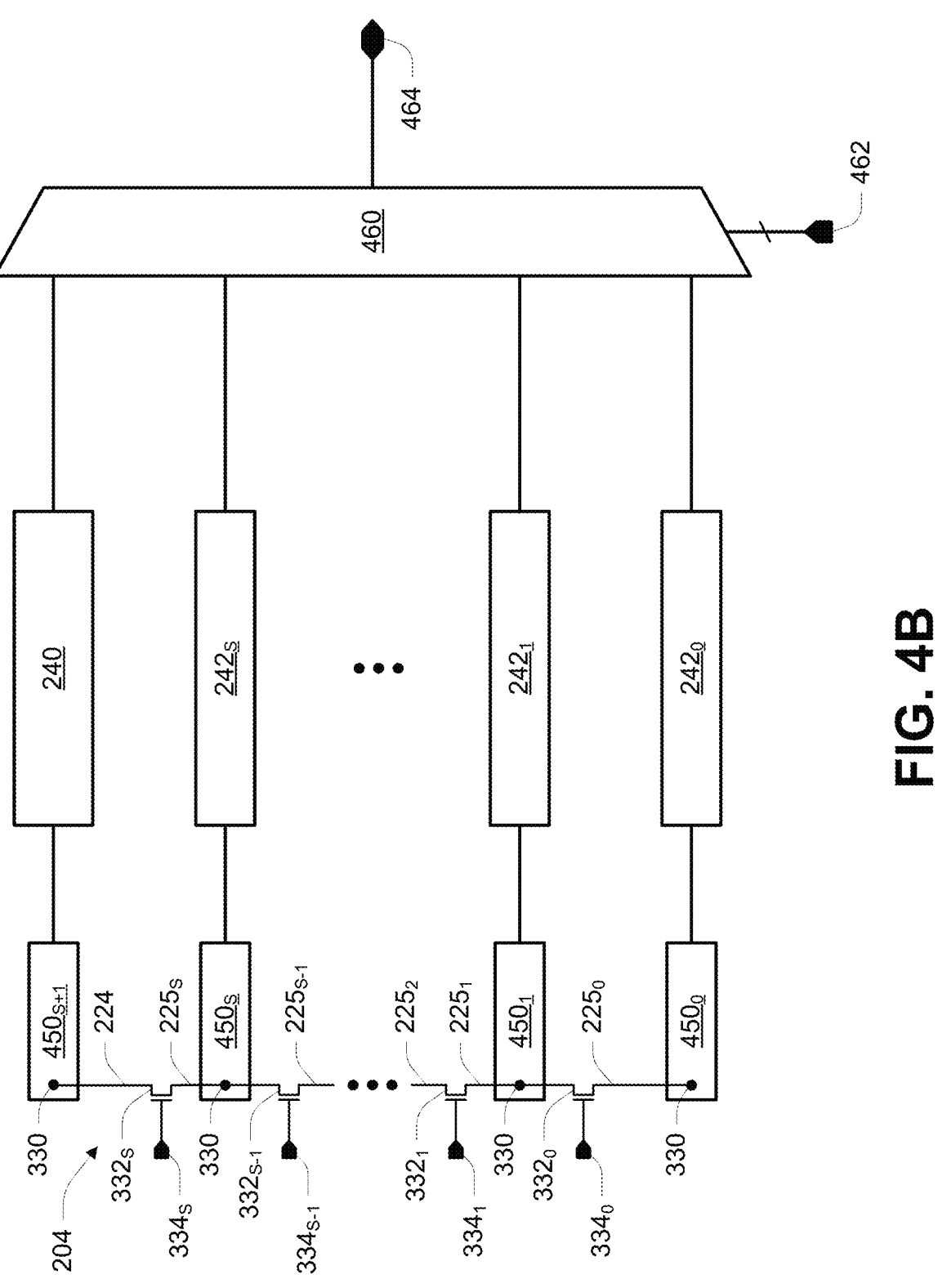

FIGS. 4A-4B are schematics of a data line having data line segments connected to respective page buffers through isolation devices in accordance with other embodiments. In FIG. 4A, a data line 204 includes a primary data line segment 224 and a secondary data line segment 225 selectively connected to one another through a switch 332 responsive to a control signal 334.

The primary data line segment 224 might be connected to a first isolation device $450_0$ through data line contact 330. The first isolation device $450_0$ might include a first field-effect transistor $452_0$ connected between the primary data line segment 224 and the primary page buffer 240. The first isolation device $450_0$ might further include a second field-effect transistor $456_0$ connected between the primary data line segment 224 and a source, e.g., a common source 216. The first field-effect transistor $452_0$ might be activated (e.g., responsive to the control signal $454_0$) and the second field-effect transistor $456_0$ might be deactivated (e.g., responsive to the control signal $458_0$) during programming operations and read operations involving the primary data line segment 224. The first field-effect transistor $452_0$ might be deactivated (e.g., responsive to the control signal $454_0$) and the second field-effect transistor $456_0$ might be activated (e.g., responsive to the control signal $458_0$) during erase operations involving the primary data line segment 224.

The secondary data line segment 225 might be connected to a second isolation device $450_1$ through data line contact 330. The second isolation device $450_1$ might include a first field-effect transistor $452_1$ connected between the secondary data line segment 225 and the secondary page buffer 242. The second isolation device $450_1$ might further include a second field-effect transistor $456_1$ connected between the secondary data line segment 225 and the source, e.g., the common source 216. The first field-effect transistor $452_1$ might be activated (e.g., responsive to the control signal $454_1$) and the second field-effect transistor $456_1$ might be deactivated (e.g., responsive to the control signal $458_1$) during programming operations and read operations involving the secondary data line segment 225. The first field-effect transistor $452_1$ might be deactivated (e.g., responsive to the control signal $454_1$) and the second field-effect transistor $456_1$ might be activated (e.g., responsive to the control signal $458_1$) during erase operations involving the secondary data line segment 225.

The primary page buffer 240 might be connected to a multiplexer 460. The secondary page buffer 242 might also be connected to the multiplexer 460. For the example of FIG. 4A, the multiplexer 460 is depicted to be a 2:1 multiplexer for selectively connecting either the primary page buffer 240 or the secondary page buffer 242 to a data node 464 of the multiplexer 460 responsive to a control signal 462. However, due to the numbers of page buffers in a typical memory, multiplexing in a data path of a memory generally involves several levels of multiplexing to connect one of a multitude of page buffers to a conductive node (e.g., a single conductive node) of the I/O bus 134. The multiplexer 460 might further function as a de-multiplexer for selectively providing data values received at its data node 464 (e.g., from a conductive node of the I/O bus 134) to the primary page buffer 240 for programming to either the memory plane corresponding to the primary data line segment 224, or to the memory plane corresponding to the secondary data line segment 225, e.g., responsive to the control signal 462. For embodiments having a secondary page buffer 242 incapable of performing a programming operation, control of the multiplexer 460 might not be configured to provide data values to that secondary page buffer 242. The data node 464 might be in communication with the I/O control circuitry 112 of the memory for input of data to the memory, and/or output of data from the memory.

During certain access operations, e.g., programming operations, erase operations, and/or sequential read operations, the switch 332 might be closed (e.g., the field-effect transistor 332 might be activated) to connect the primary data line segment 224 to the secondary data line segment 225. In this manner, the primary page buffer 240 could be used to sense, and/or program, the data state of any memory cell selectively connected to the data line 204. During other access operations, e.g., random read operations, the switch 332 might be open (e.g., the field-effect transistor 332 might be deactivated) to isolate the primary data line segment 224 from the secondary data line segment 225. In this manner, the primary page buffer 240 could be used to sense the data state of any memory cell selectively connected (e.g., through a select gate directly connected) to the primary data line segment 224, and the secondary page buffer 242 could be used to sense the data state of any memory cell selectively connected (e.g., through a select gate directly connected) to the secondary data line segment 225. In addition, while isolated, such read operations could be performed concurrently on a memory cell selectively connected to the primary data line segment 224 and on a memory cell selectively connected to the secondary data line segment 225. As used herein, a first act and a second act occur concurrently when the first act occurs simultaneously with the second act for at least a portion of a duration of the second act.

Although generally considered to be less efficient, erase operations and sequential read operations could be performed with the switch 332 open. For example, for erase operations, memory cells selectively connected to the primary data line segment 224 and memory cells selectively connected to the secondary data line segment 225 could be erased without being connected to their respective primary page buffer 240 or secondary page buffer 242. An erase verify (e.g., sensing for the erased data state) for memory cells selectively connected to the primary data line segment 224 could be performed by the primary page buffer 240, while an erase verify for memory cells selectively connected to the secondary data line segment 225 could be performed by the secondary page buffer 242. Similarly, for sequential read operations, data states of memory cells selectively connected (e.g., through a select gate directly connected) to the primary data line segment 224 could be sensed by the primary page buffer 240 while the sequential read addresses correspond to those memory cells, and data states of memory cells selectively connected (e.g., through a select gate directly connected) to the secondary data line segment 225 could be sensed by the secondary page buffer 242 while the sequential read addresses correspond to those memory cells.

Although the forgoing examples addressed the structure of an array of memory cells including two memory planes, the concepts addressed herein can be expanded to include more than two memory planes. In FIG. 4B, a data line 204 includes a primary data line segment 224, and multiple secondary data line segments $225_0$ to $225_S$ selectively connected to one another through a plurality of switches $332_0$ to $332_S$. Each switch $332_0$ to $332_S$ is responsive to a respective control signal $334_0$ to $334_S$. For some embodiments, the control signals $334_0$ to $334_S$ might be a same control signal.

The secondary data line segments $225_0$ to $225_S$ might each be connected to a respective isolation device $450_0$ to $450_S$ through a respective data line contact 330. The primary data line segment 224 might be connected to a respective isolation device $450_{S+1}$ through a respective data line contact 330. The isolation devices 450 might have a structure similar to (e.g., the same as) the structure depicted in FIG. 4A. In general, however, the isolation devices 450 might have any combination of circuit elements configured to either connect the data line 204 to its respective primary page buffer 240 or secondary page buffer 242, or isolate it therefrom.

In FIG. 4B, the primary page buffer 240 might be connected to a multiplexer 460. Each secondary page buffer $242_0$ to $242_S$ might also be connected to the multiplexer 460. For the example of FIG. 4B, the multiplexer 460 might be a (S+1):1 multiplexer for selectively connecting either the primary page buffer 240 or one of the secondary page buffers $242_0$ to $242_S$ to a data node 464 of the multiplexer 460 responsive to a control signal 462. However, due to the numbers of page buffers in a typical memory, multiplexing in a data path of a memory typically involves several levels of multiplexing to connect one of a multitude of page buffers to a conductive node (e.g., a single conductive node) of the I/O bus 134. The multiplexer 460 might further function as a de-multiplexer for selectively providing data values received at its data node 464 (e.g., from a conductive node of the I/O bus 134) to the primary page buffer 240 for programming to either the memory plane corresponding to the primary data line segment 224, or to a memory plane corresponding to any of the secondary data line segments $225_0$ to $225_S$, e.g., responsive to the control signal 462. For embodiments having a secondary page buffer 242 incapable of performing a programming operation, control of the multiplexer 460 might not be configured to provide data values to that secondary page buffer 242. The data node 464 might be in communication with the I/O control circuitry 112 of the memory for input of data to the memory, and/or output of data from the memory.

During certain access operations, e.g., programming operations, erase operations, and/or sequential read operations, the switches 332 (e.g., switches $332_0$ to $332_S$) might be closed (e.g., the field-effect transistors 332 might each be activated) to connect the primary data line segment 224 to each of the secondary data line segments 225 (e.g., secondary data line segments $225_0$ to $225_S$). In this manner, the primary page buffer 240 could be used to sense, and/or program, the data state of any memory cell selectively connected to the data line 204. During other access operations, e.g., random read operations, the switches 332 (e.g., switches $332_0$ to $332_S$) might be open (e.g., the field-effect transistors 332 might be deactivated) to isolate the primary data line segment 224 and the secondary data line segments 225 (e.g., secondary data line segments $225_0$ to $225_S$) from one another. In this manner, the primary page buffer 240 could be used to sense the data state of any memory cell selectively connected (e.g., through a select gate directly connected) to the primary data line segment 224, and the secondary page buffers 242 (e.g., secondary page buffers $242_0$ to $242_S$) could each be used to sense the data state of any memory cell selectively connected (e.g., through a select gate directly connected) to their respective secondary data line segment 225. In addition, while the primary data line segment 224 and the secondary data line segments 225 are isolated from one another, such read operations could be performed concurrently on a memory cell selectively connected to the primary data line segment 224 and on a respective memory cell selectively connected to each of the secondary data line segments 225.

Although generally considered to be less efficient, erase operations and sequential read operations could be performed with the switches 332 (e.g., switches $332_0$ to $332_S$) open. For example, for erase operations, memory cells selectively connected to the primary data line segment 224 and memory cells selectively connected to each of the secondary data line segments 225 (e.g., secondary data line segments $225_0$ to $225_S$) could be erased without being connected to their respective primary page buffer 240 or secondary page buffer 224. An erase verify (e.g., sensing for the erased data state) for memory cells selectively connected to the primary data line segment 224 could be performed by the primary page buffer 240, while an erase verify for memory cells selectively connected to any of the secondary data line segments 225 (e.g., data line segments $225_0$ to $225_S$) could be performed by their respective secondary page buffer 242. Similarly, for sequential read operations, data states of memory cells selectively connected (e.g., through a select gate directly connected) to the primary data line segment 224 could be sensed by the primary page buffer 240 while the sequential read addresses correspond to those memory cells, and data states of memory cells selectively connected (e.g., through a select gate directly connected) to any of the secondary data line segments 225 (e.g., secondary data line segments $225_0$ to $225_S$) could be sensed by their respective secondary page buffer 242 while the sequential read addresses correspond to those memory cells.

Figure 5A:
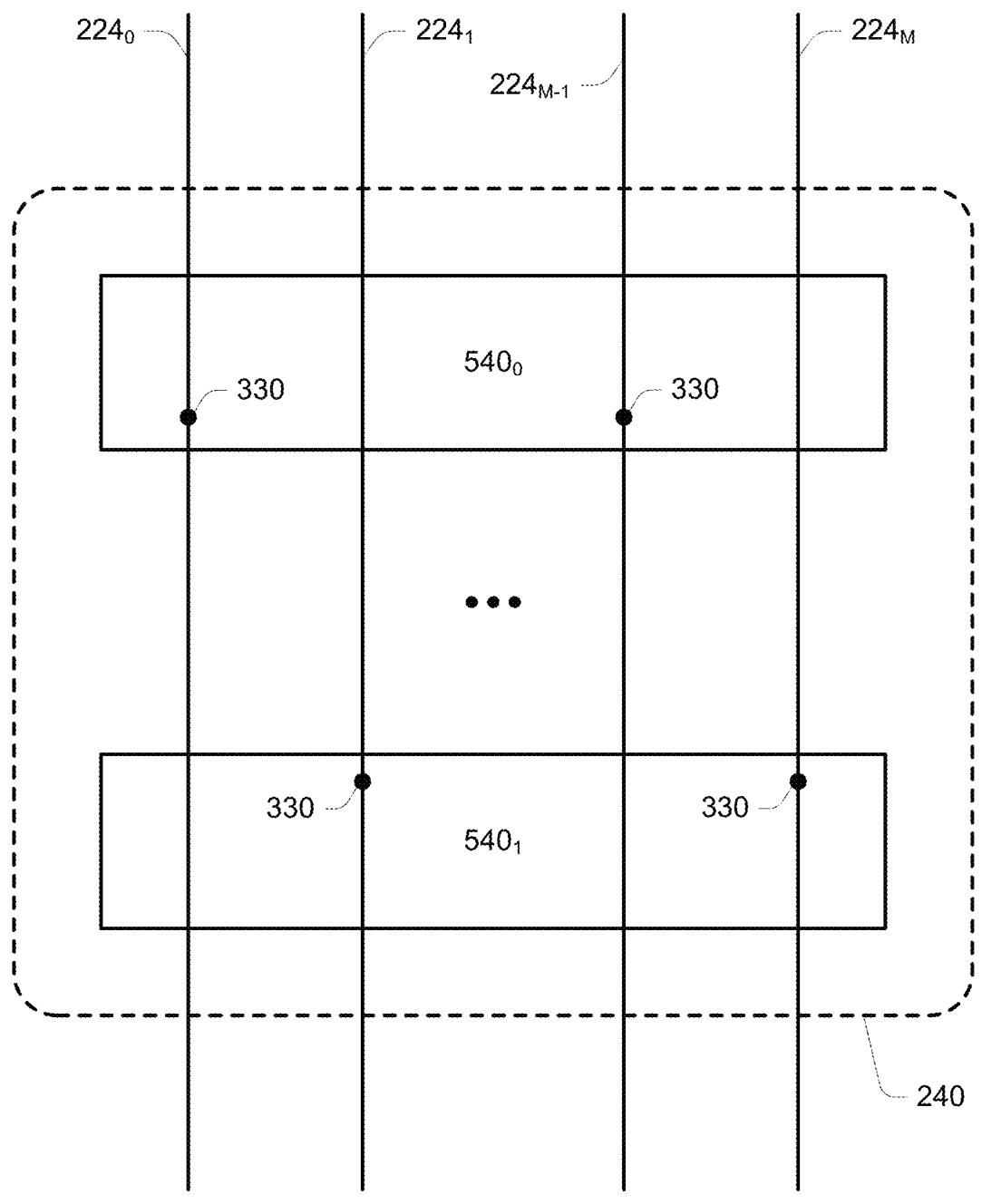
FIGS. 5A-5B are block schematics of a connection of data line segments to respective page buffer portions in accordance with embodiments.
Figure 5B:
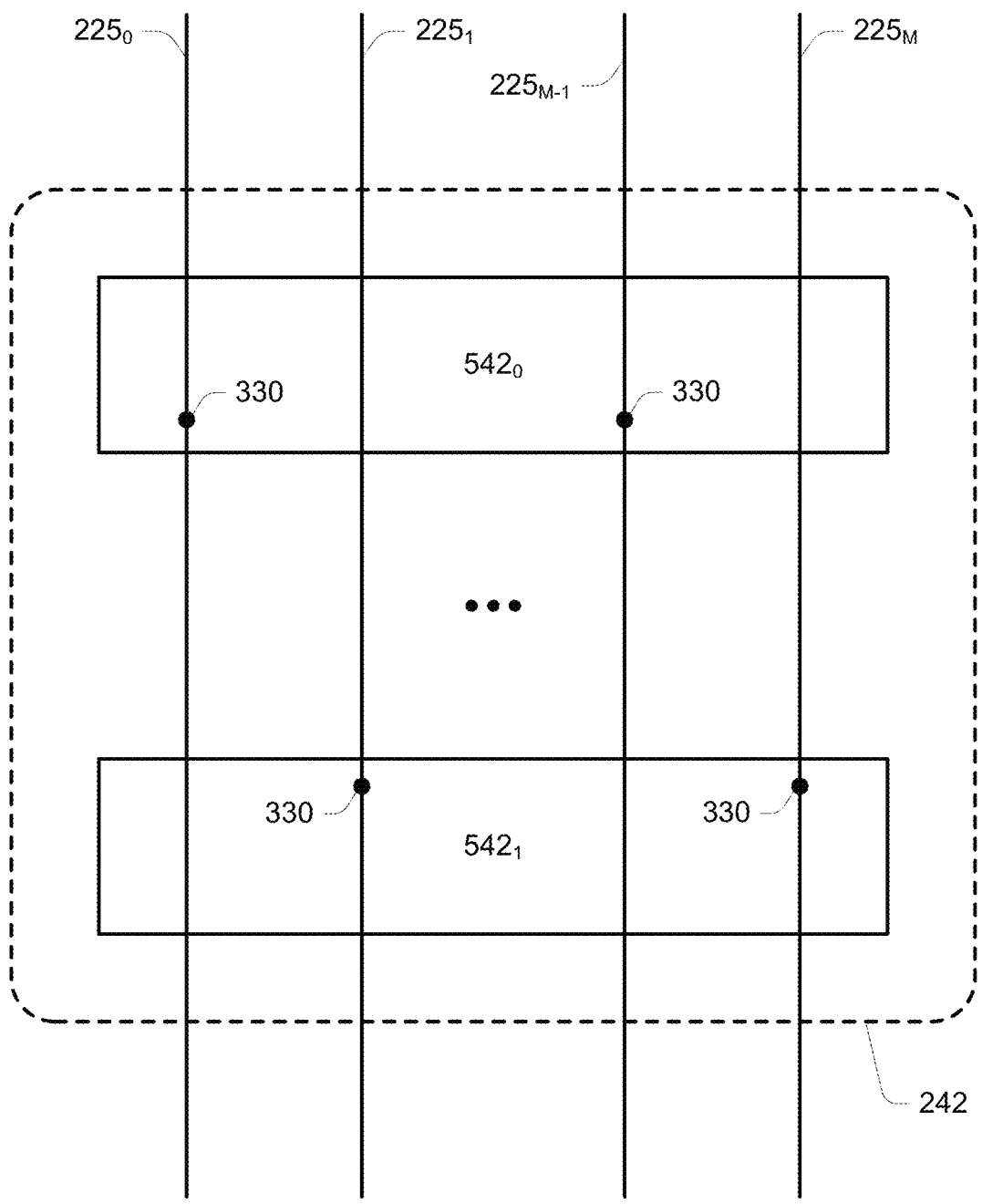

FIGS. 5A-5B are block schematics of a connection of data line segments to respective page buffer portions in accordance with embodiments. It is expected that spacing between circuitry within a primary or secondary page buffer associated with a data line might be wider than spacing of the data lines themselves. Accordingly, such circuitry within a primary or secondary page buffer might be divided into separate buffer portions, with each buffer portion connected (e.g., selectively connected) to a subset of the data lines.

In FIG. 5A, a primary page buffer 240 might include a first primary page buffer portion $540_0$ and a second primary page buffer portion $540_1$. The first primary page buffer portion $540_0$ might be connected (e.g., selectively connected) to a first subset of primary data line segments 224, e.g., even primary data line segments $224_0$, $224_2$, $224_4$, etc., through respective data line contacts 330. The second primary page buffer portion $540_1$ might be connected (e.g., selectively connected) to a second subset of primary data line segments 224 mutually exclusive to the first subset of primary data line segments 224, e.g., odd primary data line segments $224_1$, $224_3$, $224_5$, etc., through respective data line contacts 330. Although primary data line segments $224_2$-

$224_5$ are not explicitly depicted in FIG. 5A, it is apparent from the figure that the primary data line segments 224 might be numbered consecutively from primary data line segment $224_0$ to primary data line segment $224_M$. Although not depicted in FIG. 5A, the connection (e.g., selective connection) of the primary page buffer portions 540 to their respective primary data line segments 224 might be through isolation devices as described with reference to FIGS. 4A-4B.

In FIG. 5B, a secondary page buffer 242 might include a first secondary page buffer portion $542_0$ and a second secondary page buffer portion $542_1$. The first secondary page buffer portion $542_0$ might be connected (e.g., selectively connected) to a first subset of secondary data line segments 225, e.g., even secondary data line segments $225_0$, $225_2$, $225_4$, etc., through respective data line contacts 330. The second secondary page buffer portion $542_1$ might be connected (e.g., selectively connected) to a second subset of secondary data line segments 225 mutually exclusive to the first subset of secondary data line segments 225, e.g., odd secondary data line segments $225_1$, $225_3$, $225_5$, etc., through respective data line contacts 330. Although secondary data line segments $225_2$-$225_5$ are not explicitly depicted in FIG. 5B, it is apparent from the figure that the secondary data line segments 225 might be numbered consecutively from secondary data line segment $225_0$ to secondary data line segment $225_M$. Although not depicted in FIG. 5B, the connection (e.g., selective connection) of the secondary page buffer portions 542 to their respective secondary data line segments 225 might be through isolation devices as described with reference to FIGS. 4A-4B.

FIG. 6A is a schematic of a primary data line segment 224 of a data line 204 connected to a NAND string 206 and to a respective primary page buffer 240 in accordance with an embodiment. Although not depicted in FIG. 6A, the connection (e.g., selective connection) of the primary page buffer 240 to the primary data line segment 224 might be through an isolation device as described with reference to FIGS. 4A-4B. The primary page buffer 240 might include a sensing module 670 and a data line driver module 672, e.g., for each data line 204 connected thereto. The sensing module 670 might include circuitry configured to support a read operation on a memory cell selectively connected to the primary data line segment 224. As such, it might include circuitry configured to determine, and provide for output, a data state of a memory cell, e.g., a memory cell 208 of a NAND string 206, selectively connected to the primary page buffer 240, and thus to the sensing module 670. The data line driver module 672 might include circuitry configured to support a programming phase of a programming operation on a memory cell selectively connected to the primary data line segment 224. As such, it might include circuitry configured to store received data, e.g., received in association with a write command, as well as circuitry configured to drive particular voltage levels to the data line 204 to enable, or inhibit, programming of a memory cell in response to the value, or values, of the received data. Note that a programming operation would further utilize the sensing module 670 for a verify portion of the programming operation.

Embodiments described herein are not limited to a particular configuration of a sensing module 670, or to a particular configuration of a data line driver module 672. The design of such circuitry is well understood. Furthermore, although the sensing module 670 is depicted to be distinct from, and in parallel with, the data line driver module 672, the sensing module 670 and the data line driver module 672 might share some circuitry, and/or the data line driver module 672 might be selectively connected to the primary data line segment 224, and/or to I/O control circuitry 112, through components of the sensing module 670.

FIG. 6B is a schematic of a secondary data line segment 225 of a data line 204 connected to a NAND string 206 and to a respective secondary page buffer 242 in accordance with an embodiment. Although not depicted in FIG. 6B, the connection (e.g., selective connection) of the secondary page buffer 242 to the secondary data line segment 225 might be through an isolation device as described with reference to FIGS. 4A-4B. The secondary page buffer 242 might include a sensing module 670 as described with reference to FIG. 6A, e.g., for each data line 204 connected thereto. While the secondary page buffer 242 might further include a data line driver module 672, certain advantages can be attained by eliminating the data line driver module 672 from the secondary page buffer 242, e.g., for each data line 204 connected thereto. Because of the selective connection of the secondary data line segment 225 to the primary data line segment 224, programming operations can be performed for all memory cells selectively connected to the data line 204 using the primary page buffer 240. This facilitates the improvements in random read performance of a multiple-memory-plane device, but without full duplication of page buffer circuitry of the related art. For example, the combined page buffer circuitry including a primary page buffer 240 having a sensing module 670 and a data line driver module 672, and a secondary page buffer 242 having a sensing module 670 devoid of a data line driver module 672, might take on the order of 20% more area than a single-memory-plane device having only a single page buffer, but might provide the random read performance of a two-memory-plane device. Alternatively, the combined page buffer circuitry including a primary page buffer 240 having a sensing module 670 and a data line driver module 672, and a secondary page buffer 242 having a sensing module 670 devoid of a data line driver module 672, might take on the order of 40% less area than a two-memory-plane device having two full page buffers while providing similar random read performance. In addition, by isolating the secondary data line segment 225 from the primary data line segment 224, read operations performed on memory cells selectively connected to either data line segment can facilitate improved read time over a single-memory-plane device due to the lower RC time constant of an individual data line segment 224 or 225 versus the RC time constant of the full data line 204.

Figures 7A, 7B:
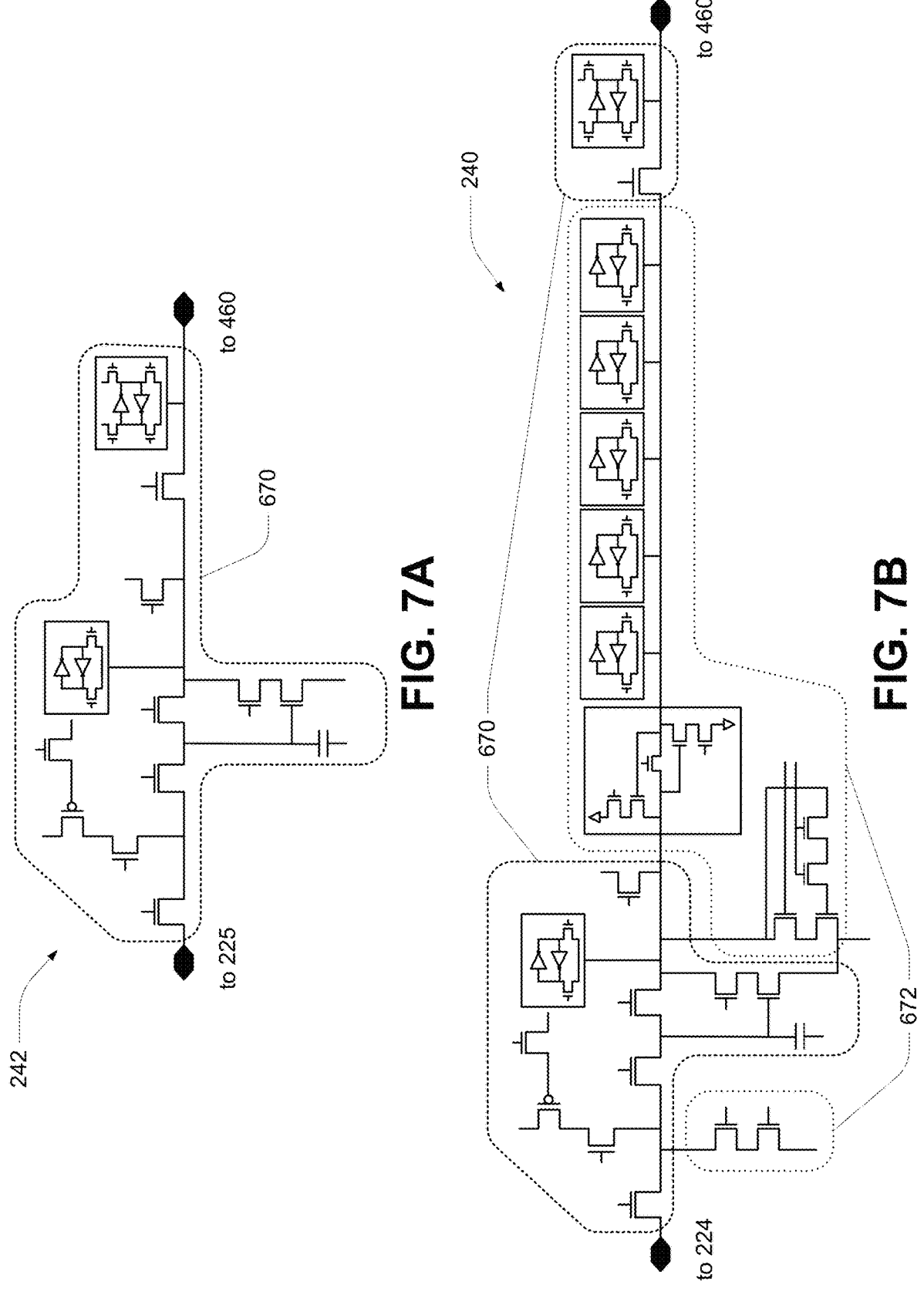
FIG. 7A is a schematic of a secondary page buffer having a sensing module for use with embodiments.
FIG. 7B is a schematic of a primary page buffer having a sensing module and data line driver module for use with embodiments.

FIGS. 7A-7B depict schematics of a secondary page buffer 242 and a primary page buffer 240, respectively. Circuit elements of the schematics are not individually identified or discussed as FIGS. 7A-7B are provided simply to conceptually illustrate relative area differences between a page buffer having only a sensing module, and a page buffer having a sensing module and a data line driver. FIG. 7A is a schematic of a secondary page buffer 242 having a sensing module 670 for use with embodiments. FIG. 7B is a schematic of a primary page buffer 240 having a sensing module 670 and data line driver module 672 for use with embodiments. In FIG. 7B, the elements identified as the data line driver module 672 might include only those elements not necessary to support a read operation, noting that some elements of the sensing module 670 might also be used in driving a data line 204. In addition to the depicted area differences between a primary page buffer 240 and a secondary page buffer 242, it is noted that because the secondary page buffer 242 of FIG. 7A contains fewer circuit elements requiring control signals, a reduction in the number of associated signal drivers and multiplexers used in generating those control signals might further contribute to the area savings of the secondary page buffer 242 versus the primary page buffer 240.

Figure 8:
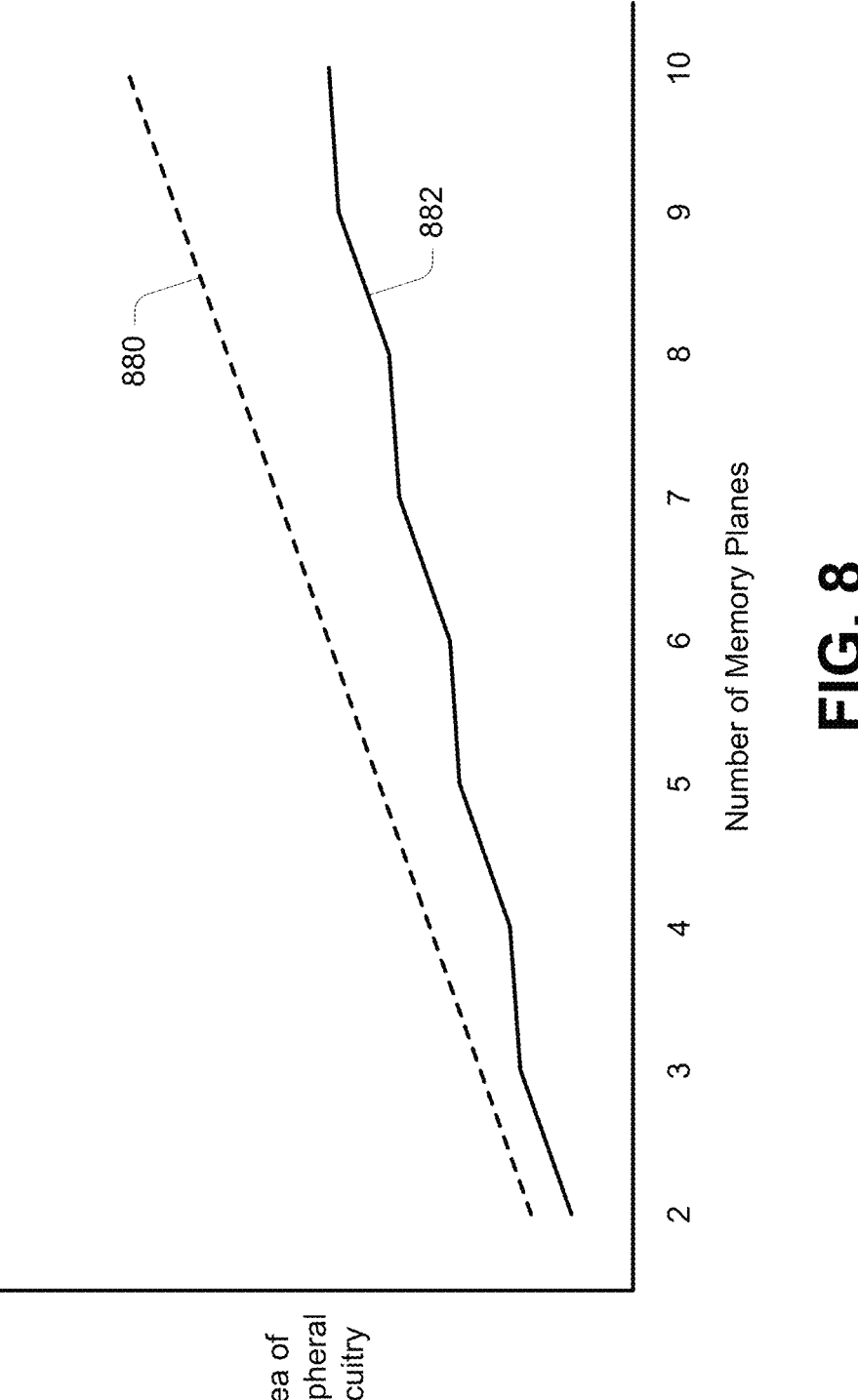
FIG. 8 is a graph depicting relative area differences of peripheral circuitry for certain embodiments versus the related art.

FIG. 8 is a graph depicting relative area differences of peripheral circuitry for certain embodiments versus the related art. Line 880 might represent memory devices of the related art having a dedicated page buffer, including a sensing module and a data line driver module, for each plane of the memory device. Line 882 might represent memory devices in accordance with embodiments. For the example of FIG. 8, a two-memory-plane device of line 882 might include two memory planes having a structure such as depicted in FIG. 4A. A three-memory-plane device of line 882 might include two memory planes having a structure such as depicted in FIG. 4A, and the third memory plane might have an additional primary page buffer dedicated to the third memory plane, and isolated from the first two memory planes. A four-memory-plane device of line 882 might include a first set of two memory planes having a structure such as depicted in FIG. 4A, and a second set of two memory planes having a structure such as depicted in FIG. 4A, and so on. Additional area savings might be attained by utilizing a structure such as depicted in FIG. 4B for devices having more than two memory planes.

Figure 9:
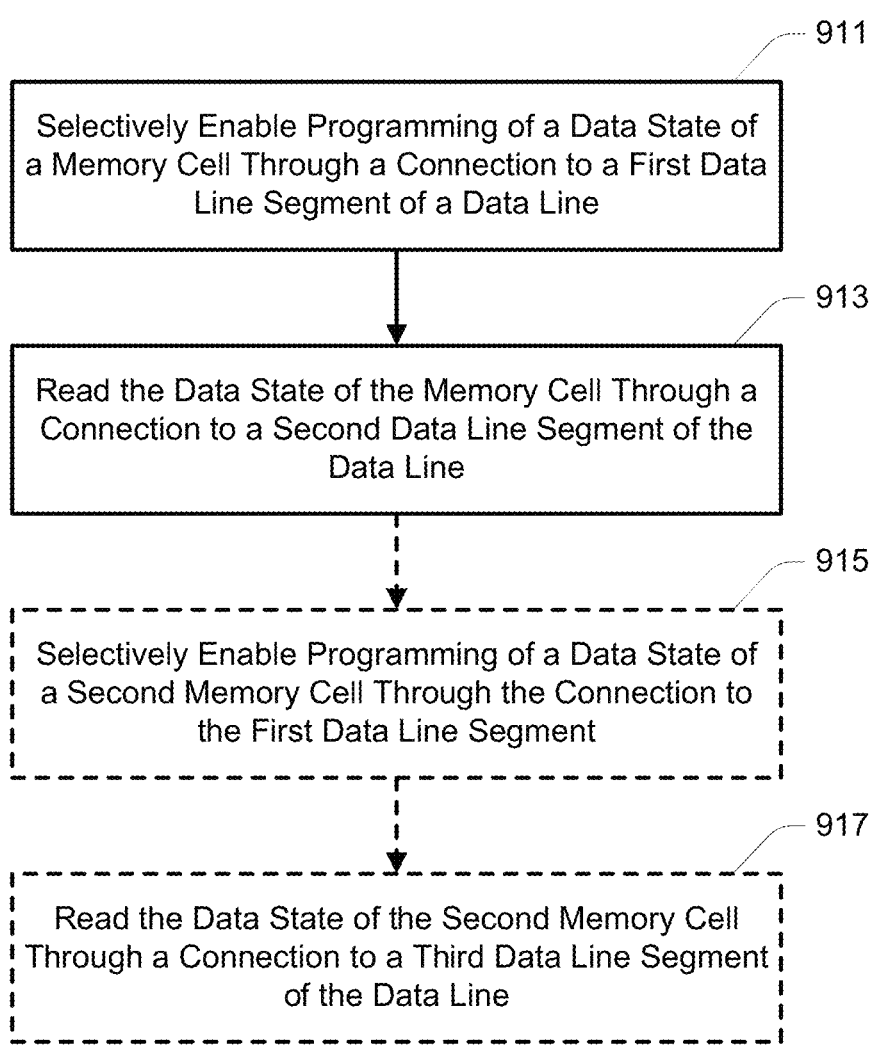
FIG. 9 is a flowchart of a method of operating a memory in accordance with an embodiment.

FIG. 9 is a flowchart of a method of operating a memory in accordance with an embodiment. The method might be in the form of computer-readable instructions, e.g., stored to the instruction registers 128. Such computer-readable instructions might be executed by a controller, e.g., the control logic 116, to cause the relevant components of the apparatus to perform the method.

At 911, a data state of a memory cell might be enabled for programming through a connection to a first data line segment of a data line. For example, a memory cell selectively connected to a secondary data line segment 225 might be selectively enabled for programming using a primary page buffer 240 through a connection (e.g., direct connection) to a primary data line segment 224 while the primary data line segment 224 is connected to the secondary data line segment 225. Selective enabling of programming refers to the enabling or inhibiting of programming in response to received data to be programmed to the memory cell. The memory cell might be selectively enabled for programming in response to data received by the memory device using a data line driver module 672 of the primary page buffer 240, and verified using a sensing module 670 of the primary page buffer 240.

At 913, the data state of the memory cell might be read through a connection to a second data line segment of the data line. For example, the memory cell selectively connected to the secondary data line segment 225 might be read using a secondary page buffer 242 through a connection (e.g., direct connection) to the secondary data line segment 225. The connection to the first data line segment might be isolated from the connection to the second data line segment while reading its data state, e.g., the secondary data line segment 225 might be isolated from the primary data line segment 224 while reading its data state. The data state of the memory cell might be read using a sensing module 670 of the secondary page buffer 242.

Optionally, at 915, a data state of a second memory cell might be programmed through the connection to the first data line segment. For example, a memory cell selectively connected to a different secondary data line segment 225 of the data line 204 might be selectively enabled for programming using the primary page buffer 240 through the connection (e.g., direct connection) to the primary data line segment 224 while the primary data line segment 224 is connected to the different secondary data line segment 225. The second memory cell might be selectively enabled for programming in response to different data received by the memory device using the data line driver module 672 of the primary page buffer 240, and verified using the sensing module 670 of the primary page buffer 240.

Optionally, at 917, the data state of the second memory cell might be read through a connection to a third data line segment of the data line. For example, the memory cell selectively connected to the different secondary data line segment 225 might be read using a different secondary page buffer 242 through a connection (e.g., direct connection) to the different secondary data line segment 225. The connection to the first data line segment might be isolated from the connection to the third data line segment while reading the data state of the second memory cell, e.g., the primary data line segment 224 might be isolated from the different secondary data line segment 225 while reading its data state. The connection to the third data line segment might further be isolated from the connection to the second data line segment while reading the data state of the second memory cell, e.g., the different secondary data line segment 225 might be isolated from the secondary data line segment 225 (e.g., first secondary data line segment 225) while reading its data state. The data state of the second memory cell might be read using a sensing module 670 of the different secondary page buffer 242. The process of 915 and 917 might be repeated for additional memory cells selectively connected to additional secondary data line segments 225.

Figure 10:
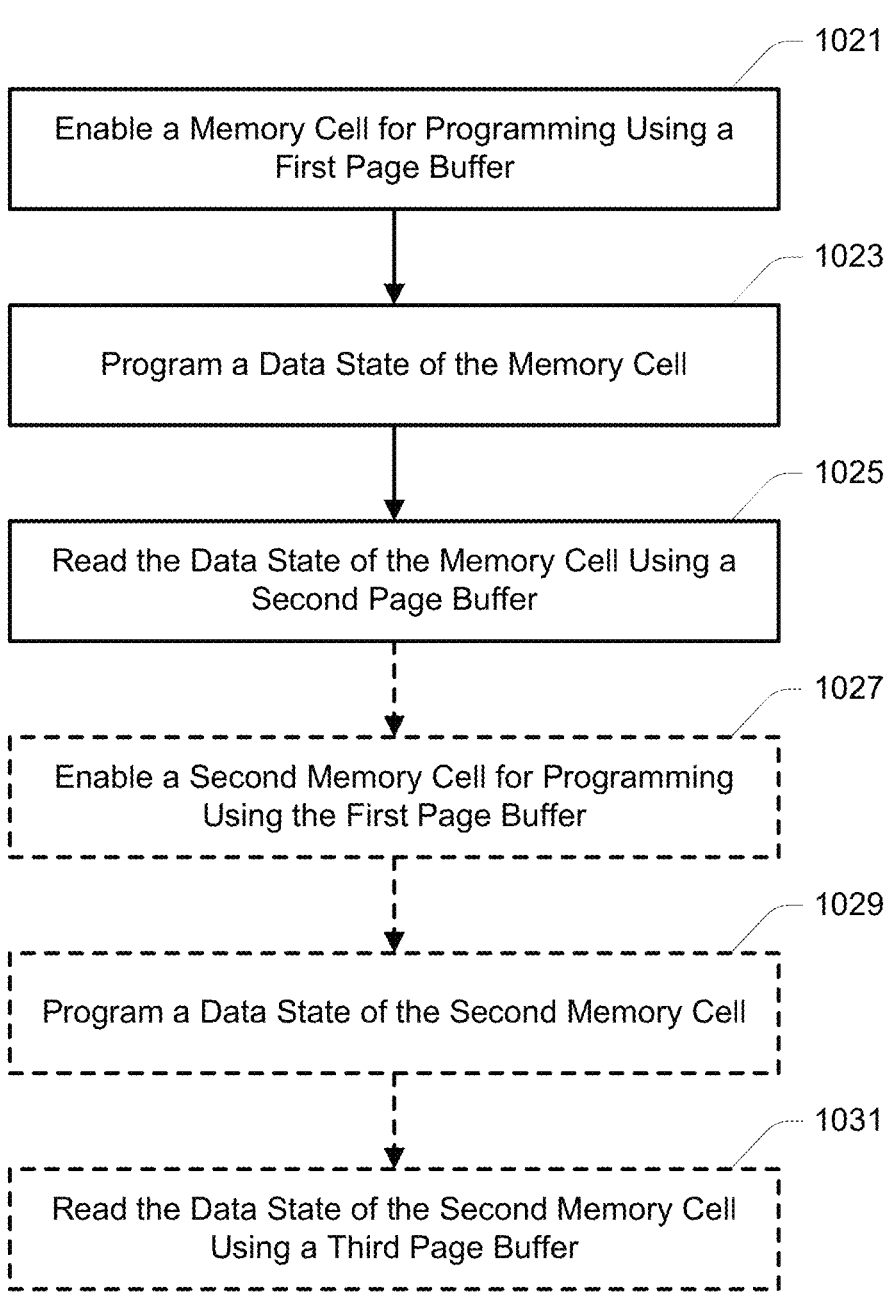
FIG. 10 is a flowchart of a method of operating a memory in accordance with another embodiment.

FIG. 10 is a flowchart of a method of operating a memory in accordance with another embodiment. The method might be in the form of computer-readable instructions, e.g., stored to the instruction registers 128. Such computer-readable instructions might be executed by a controller, e.g., the control logic 116, to cause the relevant components of the apparatus to perform the method.

At 1021, a memory cell might be enabled for programming using a first page buffer. The memory cell might be enabled for programming in response to a write command received by the memory from an external device, e.g., a memory controller or other processor 130. The write command might be associated with data (e.g., one or more digits of data) indicative of a desired data state of the memory cell. Enabling the memory cell for programming might include driving a particular voltage level, e.g., an enable voltage level, onto a data line, including a data line segment, selectively connected to the memory cell. The data line segment might be a secondary data line segment 225. The first page buffer might be a primary page buffer 240 including a sensing module 670 and a data line driver module 672. Driving the data line might include using the data line driver module 672 to drive the data line.

At 1023, a data state, e.g., the desired data state, of the memory cell might be programmed. Programming the data state might include applying a programming voltage level to a control gate of the memory cell while it is enabled for programming by a data line driver module 672 of a primary page buffer 240, and subsequently verifying, e.g., by the sensing module 670 of the primary page buffer 240, whether the desired data state has been attained. As is well understood, additional programming pulses of increasing voltage levels might be applied, and additional verifications might be performed, until the memory cell has either attained its desired data state, or a failure condition is declared.

At 1025, the data state of the memory cell might be read using a second page buffer different than the first page buffer. The second page buffer might be a secondary page buffer 242 including a sensing module 670. The second page buffer might be devoid of a data line driver module 672. The memory cell might be isolated from the first page buffer while reading its data state using the second page buffer. Isolation of the memory cell from the first page buffer might include isolating a first data line segment, e.g., a primary data line segment 224, corresponding to the first page buffer, from a second data line segment, e.g., a secondary data line segment 225, selectively connected to the memory cell and corresponding to the second page buffer.

Optionally, at 1027, the memory cell might be a first memory cell, and a second memory cell might be enabled for programming using the first page buffer. The second memory cell might be enabled for programming in response to a write command, e.g., a different write command, received by the memory from an external device, e.g., a memory controller or other processor 130. The write command might be associated with data (e.g., one or more digits of data) indicative of a desired data state of the second memory cell. Enabling the second memory cell for programming might include driving a particular voltage level, e.g., an enable voltage level, onto the data line, including a data line segment, selectively connected to the second memory cell. The data line segment might be a different secondary data line segment 225.

Optionally, at 1029, a data state, e.g., the desired data state, of the second memory cell might be programmed. Programming the data state might include applying a programming voltage level to a control gate of the second memory cell while it is enabled for programming by a data line driver module 672 of a primary page buffer 242, and subsequently verifying, e.g., by the sensing module 670 of the primary page buffer 242, whether the desired data state has been attained. As is well understood, additional programming pulses of increasing voltage levels might be applied, and additional verifications might be performed, until the second memory cell has either attained its desired data state, or a failure condition is declared.

Optionally, at 1031, the data state of the second memory cell might be read using a third page buffer different than the first page buffer and different than the second page buffer. The third page buffer might be a secondary page buffer 242 including a sensing module 670. The third page buffer might be devoid of a data line driver module 672. The second memory cell might be isolated from the first page buffer while reading its data state using the third page buffer. The second memory cell might further be isolated from the second page buffer while reading its data state using the third page buffer. Isolation of the second memory cell from the first page buffer might include isolating the first data line segment, e.g., a primary data line segment 224, corresponding to the first page buffer, from a third data line segment, e.g., a secondary data line segment 225, selectively connected to the second memory cell and corresponding to the third page buffer. Isolation of the second memory cell from the second page buffer might include isolating the third data line segment from the second data line segment, e.g., a different secondary data line segment 225, selectively connected to the first memory cell and corresponding to the second page buffer.

Figure 11:
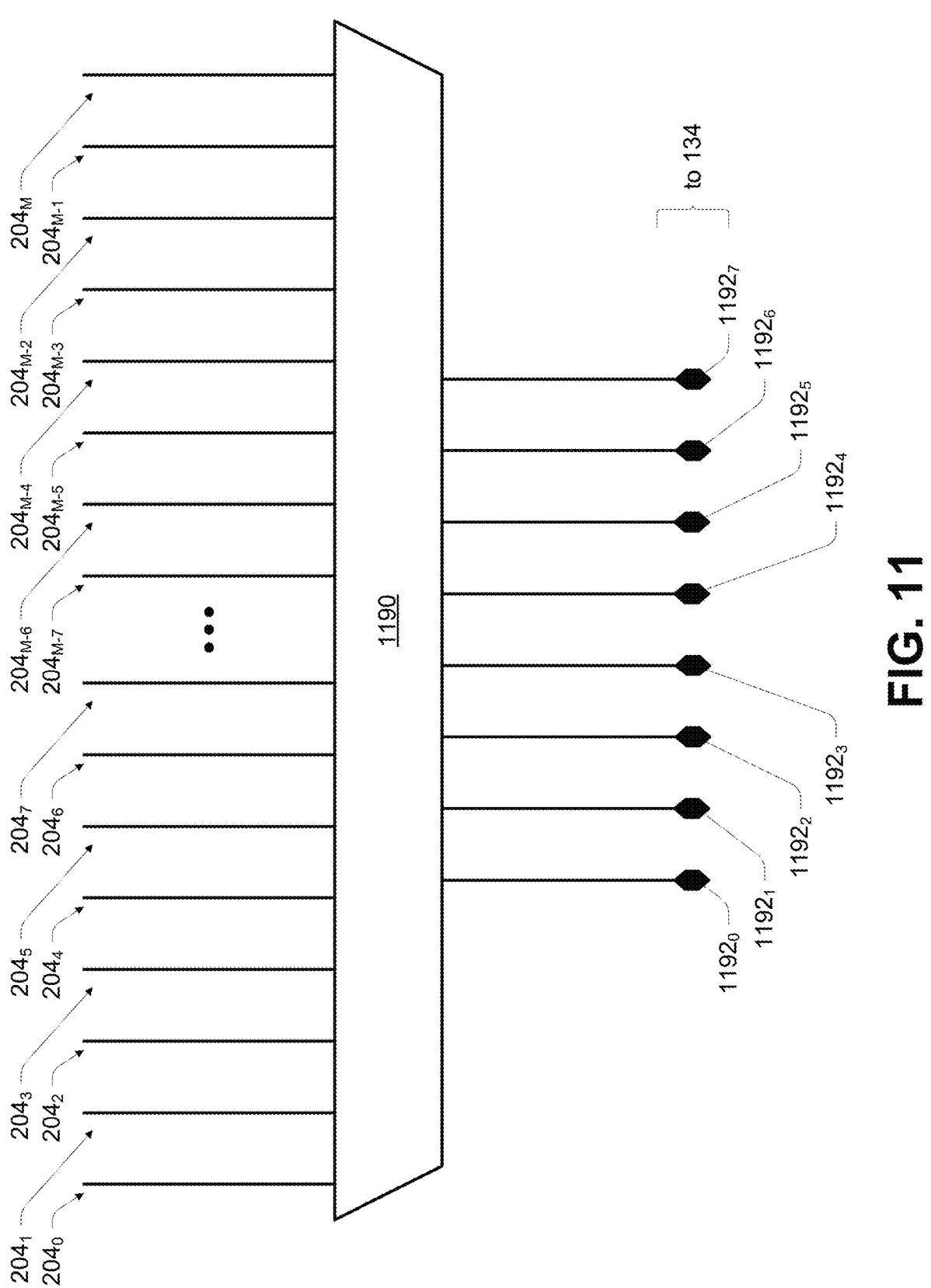
FIG. 11 is a block schematic of a multiplexed data path for use with embodiments.

FIG. 11 is a block schematic of a multiplexed data path for use with embodiments. Generally, individual data lines are configured to be in communication with a corresponding conductive node for input of data to its corresponding memory cells, or output of data from its corresponding memory cells, through a multiplexed data path. With reference to FIG. 11, a plurality of data lines $204_0$ to $204_M$ might be in selective communication with a plurality of conductive nodes $1192_0$ to $1192_7$ through a multiplexed data path 1190. The example of FIG. 11 might represent an 8-bit device, and the integer value of M+1 might be some multiple of eight.

The multiplexed data path 1190 might represent any circuitry, e.g., page buffers, multiplexers, signal drivers, I/O buffers, etc., for communication between the data lines 204 and the conductive nodes 1192. For some embodiments, each time data is input for programming to a memory cell, or data in that memory cell is read for output, the data line 204, and thus the data line segment 224 or 225, corresponding to that memory cell might be in communication with a same conductive node 1192. For example, data I/O for memory cells selectively connected to data line $204_0$ might always pass through conductive node $1192_0$, data I/O for memory cells selectively connected to data line $204_1$ might always pass through conductive node $1192_1$, data I/O for memory cells selectively connected to data line $204_2$ might always pass through conductive node $1192_2$, data I/O for memory cells selectively connected to data line $204_3$ might always pass through conductive node $1192_3$, data I/O for memory cells selectively connected to data line $204_4$ might always pass through conductive node $1192_4$, data I/O for memory cells selectively connected to data line $204_5$ might always pass through conductive node $1192_5$, data I/O for memory cells selectively connected to data line $204_6$ might always pass through conductive node $1192_6$, and data I/O for memory cells selectively connected to data line $204_7$ might always pass through conductive node $1192_7$. This pattern might repeat for each set of eight data lines 204 such that data lines $204_{M-7}$ to $204_M$ might be in selective communication with conductive nodes $1192_0$ to $1192_7$, respectively. Alternatively, each set of eight even-numbered data lines, e.g., data lines $204_0$, $204_2$, $204_4$, $204_6$, $204_8$, $204_{10}$, $204_{12}$, and $204_{14}$, and each set of eight odd-numbered data lines, e.g., data lines $204_1$, $204_3$, $204_5$, $204_7$, $204_9$, $204_{11}$, $204_{13}$, and $204_{15}$, might be in selective communication with conductive nodes $1192_0$ to $1192_7$, respectively. Although data lines $204_8$-$204_{15}$ are not explicitly depicted in FIG. 11, it is apparent from the figure that the data lines 204 might be numbered consecutively from data line $204_0$ to data line $204_M$.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:

an array of memory cells;

a data line selectively connected to a plurality of memory cells of the array of memory cells, wherein the data line comprises a first data line segment corresponding to a first subset of memory cells of the plurality of memory cells and a second data line segment corresponding to a second subset of memory cells of the plurality of memory cells, and wherein the second data line segment is selectively connected to the first data line segment through a switch having a first side directly connected to the first data line segment and a second side directly connected to the second data line segment;

a first page buffer selectively connected to the first data line segment on the first side of the switch; and a second page buffer selectively connected to the second data line segment on the second side of the switch.

2. The memory of claim 1, wherein the first page buffer comprises a sensing module and a data line driver module, and wherein the second page buffer comprises a sensing module.

3. The memory of claim 2, wherein the second page buffer is devoid of a data line driver module.

4. The memory of claim 2, wherein the switch is a first switch, and wherein the data line further comprises:

a third data line segment corresponding to a third subset of memory cells of the plurality of memory cells; and a second switch having a first side directly connected to the second data line segment and a second side directly connected to the third data line segment;

wherein the third data line segment is selectively connected to the first data line segment through the second switch, the second data line segment, and the first switch;

wherein the third data line segment is selectively connected to the second data line segment through the second switch; and wherein the memory further comprises a third page buffer selectively connected to the third data line segment on the second side of the second switch.

5. The memory of claim 4, wherein the third page buffer comprises a sensing module, and wherein the third page buffer is devoid of a data line driver module.

6. The memory of claim 1, further comprising:

a controller for access of the array of memory cells, wherein the controller is configured to cause the memory to:

connect the second data line segment to the first data line segment when programming a memory cell of the second subset of memory cells; and use the first page buffer to program the memory cell of the second subset of memory cells.

7. The memory of claim 6, wherein the controller is further configured to cause the memory to:

isolate the second data line segment from the first data line segment when reading the memory cell of the second subset of memory cells; and use the second page buffer to read the memory cell of the second subset of memory cells.

8. The memory of claim 7, wherein the controller being configured to cause the memory to isolate the second data line segment from the first data line segment when reading the memory cell of the second subset of memory cells comprises the controller being configured to cause the memory to isolate the second data line segment from the first data line segment when reading the memory cell of the second subset of memory cells using a first type of read operation, and wherein the controller is further configured to cause the memory to:

connect the second data line segment to the first data line segment when reading the memory cell of the second subset of memory cells using a second type of read operation different than the first type of read operation; and use the first page buffer to read the memory cell of the second subset of memory cells using the second type of read operation.

9. The memory of claim 8, wherein the first type of read operation is a random read operation, and wherein the second type of read operation is a sequential read operation.

10. The memory of claim 1, wherein the switch is configured to isolate the second data line segment from the first page buffer when open, and is configured to permit connection of the second data line segment to the first page buffer when closed.

11. The memory of claim 10, wherein the switch comprises a field-effect transistor.

12. The memory of claim 1, wherein the first page buffer is selectively connected to the second data line segment through the first data line segment and the switch.

13. A memory, comprising:

an array of memory cells;

a data line selectively connected to a plurality of memory cells of the array of memory cells, wherein the data line comprises a first data line segment corresponding to a first subset of memory cells of the plurality of memory cells and a second data line segment corresponding to a second subset of memory cells of the plurality of memory cells, and wherein the second data line segment is selectively connected to the first data line segment through a switch;

a first page buffer selectively connected to the first data line segment, and further selectively connected to the second data line segment through the first data line segment and the switch; and a second page buffer selectively connected to the second data line segment.

14. The memory of claim 13, wherein the switch comprises one or more circuit elements configured to selectively provide either an electrical connection between the first data line segment and the second data line segment, or an electrical isolation between the first data line segment and the second data line segment.

15. The memory of claim 13, wherein the switch is a first switch, and wherein the data line further comprises:

a third data line segment corresponding to a third subset of memory cells of the plurality of memory cells; and a third page buffer selectively connected to the third data line segment;

wherein the third data line segment is selectively connected to the second data line segment through a second switch; and wherein the first page buffer is further selectively connected to the third data line segment through the first data line segment, the first switch, the second data line segment, and the second switch.

16. The memory of claim 13, further comprising:

a common source;

a first transistor connected between the first page buffer and the first data line segment;

a second transistor connected between the common source and the first data line segment;

a third transistor connected between the second page buffer and the second data line segment; and a fourth transistor connected between the common source and the second data line segment;

wherein the first transistor and the second transistor are connected in series;

wherein the third transistor and the fourth transistor are connected in series; and wherein the second transistor, the first data line segment, the switch, the second data line segment, and the fourth transistor are connected in series.

17. A memory, comprising:

an array of memory cells;

a data line selectively connected to a plurality of memory cells of the array of memory cells, wherein the data line comprises a first data line segment corresponding to a first subset of memory cells of the plurality of memory cells, a second data line segment corresponding to a second subset of memory cells of the plurality of memory cells, and a third data line segment corresponding to a third subset of memory cells of the plurality of memory cells;

a first page buffer selectively connected to the first data line segment;

a second page buffer selectively connected to the second data line segment; and a third page buffer selectively connected to the third data line segment;

wherein the second data line segment is selectively connected to the first data line segment through a first switch;

wherein the third data line segment is selectively connected to the second data line segment through a second switch; and wherein the first data line segment, the first switch, the second data line segment, the second switch, and the third data line segment are connected in series.

18. The memory of claim 17, wherein the first page buffer comprises a sensing module and a data line driver module, wherein the second page buffer comprises a sensing module, and wherein the third page buffer comprises a sensing module.

19. The memory of claim 18, wherein the second page buffer is devoid of a data line driver module, and wherein the third page buffer is devoid of a data line driver module.

20. The memory of claim 17, wherein the data line further comprises:

a fourth data line segment corresponding to a fourth subset of memory cells of the plurality of memory cells; and a fourth page buffer selectively connected to the fourth data line segment;

wherein the fourth data line segment is selectively connected to the third data line segment through a third switch; and wherein the first data line segment, the first switch, the second data line segment, the second switch, the third data line segment, the third switch, and the fourth data line segment are connected in series.

21. The memory of claim 20, wherein the first page buffer comprises a sensing module and a data line driver module, wherein the second page buffer comprises a sensing module, and wherein the third page buffer comprises a sensing module.

22. The memory of claim 21, wherein the second page buffer is devoid of a data line driver module, and wherein the third page buffer is devoid of a data line driver module.

* * * * *